(12) United States Patent
Rocholl et al.

(10) Patent No.: US 11,597,297 B2
(45) Date of Patent: *Mar. 7, 2023

(54) ELECTRONIC CONTROL SYSTEM FOR ELECTRIC REFUSE VEHICLE

(71) Applicant: Oshkosh Corporation, Oshkosh, WI (US)

(72) Inventors: Joshua D. Rocholl, Rochester, MN (US); Derek A. Wente, Austin, MN (US); John T. Kellander, Oronoco, MN (US); Cody D. Clifton, Mapleton, MN (US); Vincent Hoover, Byron, MN (US); Zachary L. Klein, Rochester, MN (US); Clinton T. Weckwerth, Pine Island, MN (US); Skylar A. Wachter, Dodge Center, MN (US)

(73) Assignee: Oshkosh Corporation, Oshkosh, WI (US)

( * ) Notice: Subject to any disclaimer, the term of this patent is extended or adjusted under 35 U.S.C. 154(b) by 320 days.

This patent is subject to a terminal disclaimer.

(21) Appl. No.: 16/851,157

(22) Filed: Apr. 17, 2020

(65) Prior Publication Data
US 2020/0346557 A1 Nov. 5, 2020

Related U.S. Application Data

(60) Provisional application No. 62/843,295, filed on May 3, 2019.

(51) Int. Cl.
*B60L 58/13* (2019.01)
*B65F 3/00* (2006.01)
(Continued)

(52) U.S. Cl.
CPC ............. *B60L 58/13* (2019.02); *B65F 3/00* (2013.01); *G01R 31/3646* (2019.01);
(Continued)

(58) Field of Classification Search
CPC ...... B60L 58/13; B60L 2260/54; B60L 58/14; B60L 2200/36; B60L 2200/40;
(Continued)

(56) References Cited

U.S. PATENT DOCUMENTS

| | | |
|---|---|---|
| 3,667,629 A | 6/1972 | La Voie |
| 3,898,806 A | 8/1975 | Press |

(Continued)

FOREIGN PATENT DOCUMENTS

| | | | |
|---|---|---|---|
| CN | 102545318 B | * 9/2014 | ............. B60L 58/13 |
| CN | 206679670 U | * 11/2017 | ................ B65F 3/14 |

OTHER PUBLICATIONS

Soriano et al., Drive Cycle Identification and Energy Demand Estimation for Refuse-Collecting Vehicles, Nov. 2015, IEEE, IEEE Transactions on Vehicular Technology, vol. 64, No. 11,pp. 4965-4973 (Year: 2015).*

(Continued)

*Primary Examiner* — M Baye Diao
(74) *Attorney, Agent, or Firm* — Foley & Lardner LLP

(57) ABSTRACT

A refuse vehicle including a chassis, a body assembly coupled to the chassis, the body assembly defining a refuse compartment, an electric energy system configured to store power and supply power to the refuse vehicle, and a power control system configured to measure one or more electrical attributes of the refuse vehicle and determine a power profile for the refuse vehicle, the power profile describing a length of time the refuse vehicle can continue to operate based on a remaining power of the electrical energy system, and wherein the power control system controls operation of a lift assembly of the refuse vehicle based on the power profile.

20 Claims, 4 Drawing Sheets

(51) Int. Cl.
*G01R 31/36* (2020.01)
*B65F 3/02* (2006.01)
*B60D 1/00* (2006.01)

(52) U.S. Cl.
CPC ..... *G01R 31/3647* (2019.01); *G01R 31/3648* (2013.01); *B60D 1/00* (2013.01); *B60L 2260/54* (2013.01); *B65F 2003/022* (2013.01); *B65F 2003/0216* (2013.01)

(58) Field of Classification Search
CPC .. B60L 1/003; B60L 2250/10; B60L 2260/52; B65F 3/00; B65F 2003/0216; B65F 2003/022; B65F 2003/0279; B65F 3/043; G01R 31/3646; G01R 31/3647; G01R 31/3648; B60D 1/00; Y02T 10/70; Y02W 30/10
USPC .......................................... 365/138; 296/101
See application file for complete search history.

(56) References Cited

U.S. PATENT DOCUMENTS

| | | | |
|---|---|---|---|
| 5,413,448 | A | 5/1995 | Peshkin |
| 5,555,171 | A | 9/1996 | Sonehara et al. |
| 5,697,741 | A | 12/1997 | Harris et al. |
| 5,779,300 | A | 7/1998 | McNeilus et al. |
| 5,829,946 | A | 11/1998 | McNeilus et al. |
| 5,931,628 | A | 8/1999 | Christenson |
| 6,290,450 | B1 | 9/2001 | Humphries et al. |
| 6,421,593 | B1 | 7/2002 | Kempen et al. |
| 6,434,512 | B1 | 8/2002 | Discenzo |
| 6,485,079 | B1 | 11/2002 | Brown et al. |
| 6,947,819 | B2 | 9/2005 | Nelson et al. |
| 8,794,886 | B1 | 8/2014 | Nett et al. |
| 8,967,699 | B1 | 3/2015 | Richmond et al. |
| 9,136,726 | B2 | 9/2015 | Shinozaki |
| 9,174,686 | B1 | 11/2015 | Messina et al. |
| 9,216,856 | B2 | 12/2015 | Howell et al. |
| 9,366,507 | B1 | 6/2016 | Richmond et al. |
| 9,707,869 | B1 | 7/2017 | Messina et al. |
| 10,158,152 | B2 * | 12/2018 | Watson ................. B60L 3/0046 |
| 10,525,648 | B2 | 1/2020 | Williams |
| 10,545,010 | B1 | 1/2020 | Leeman et al. |
| 10,611,416 | B1 | 4/2020 | Groteleuschen et al. |
| 11,021,078 | B2 * | 6/2021 | Rocholl ................. B65F 3/043 |
| 11,136,187 | B1 * | 10/2021 | Koga ........................ B65F 3/02 |
| 2002/0025245 | A1 | 2/2002 | Humphries et al. |
| 2003/0047956 | A1 | 3/2003 | Schrafel |
| 2003/0230412 | A1 | 12/2003 | Archer |
| 2004/0165977 | A1 | 8/2004 | Hecker |
| 2004/0228699 | A1 | 11/2004 | Venton-Walters et al. |
| 2006/0039771 | A1 | 2/2006 | Zhou |
| 2006/0055206 | A1 | 3/2006 | Morrow et al. |
| 2006/0087152 | A1 | 4/2006 | Kuriakose |
| 2007/0222253 | A1 | 9/2007 | Wood et al. |
| 2007/0296248 | A1 | 12/2007 | Kuriakose |
| 2008/0036232 | A1 | 2/2008 | Randjelovic et al. |
| 2008/0129068 | A1 | 6/2008 | Brummel et al. |
| 2008/0284188 | A1 | 11/2008 | Redman et al. |
| 2010/0052357 | A1 | 3/2010 | Howell et al. |
| 2011/0172837 | A1 | 7/2011 | Forbes, Jr. |
| 2011/0233952 | A1 | 9/2011 | Kuriakose et al. |
| 2013/0175975 | A1 * | 7/2013 | Shinozaki ............... B60L 58/21 320/106 |
| 2013/0251485 | A1 | 9/2013 | Howell et al. |
| 2014/0163804 | A1 | 6/2014 | Kaneko et al. |
| 2015/0151651 | A1 | 6/2015 | Stingle et al. |
| 2015/0239365 | A1 | 8/2015 | Hyde et al. |
| 2015/0314959 | A1 | 11/2015 | Le Palud et al. |
| 2016/0375805 | A1 | 12/2016 | Krueger et al. |
| 2017/0072804 | A1 | 3/2017 | De Miranda et al. |
| 2017/0361491 | A1 | 12/2017 | Datema et al. |
| 2018/0117868 | A1 | 5/2018 | Williams |
| 2018/0250847 | A1 | 9/2018 | Wurtz et al. |
| 2019/0077273 | A1 * | 3/2019 | Jang ........................ B60L 50/60 |
| 2019/0091890 | A1 | 3/2019 | Rocholl et al. |
| 2019/0121353 | A1 | 4/2019 | Datema et al. |
| 2019/0193934 | A1 | 6/2019 | Rocholl et al. |
| 2019/0218031 | A1 | 7/2019 | Whitfield et al. |
| 2019/0322321 | A1 | 10/2019 | Schwartz et al. |
| 2019/0325220 | A1 | 10/2019 | Wildgrube et al. |
| 2019/0344475 | A1 | 11/2019 | Datema et al. |
| 2020/0078986 | A1 | 3/2020 | Clifton et al. |
| 2020/0158474 | A1 | 5/2020 | Leeman et al. |
| 2020/0230841 | A1 | 7/2020 | Datema et al. |
| 2020/0230842 | A1 | 7/2020 | Datema et al. |
| 2020/0247486 | A1 | 8/2020 | Groteleuschen et al. |
| 2020/0262366 | A1 | 8/2020 | Wildgrube et al. |
| 2020/0265656 | A1 | 8/2020 | Koga et al. |

OTHER PUBLICATIONS

A New Real-Time Centralized Energy Management Strategy for Modular Electric Vehicles; Arash Khalatbarisoltani;Juan Carlos Oviedo Cepeda;Loic Boulon;David Lupien St-Pierre;Javier Solano;Cesar Duarte; 2018 IEEE Vehicle Power and Propulsion Conference (VPPC); IEEE Conference Paper. (Year: 2018).

An Online Identification Based Energy Management Strategy for a Fuel Cell Hybrid Electric Vehicle; Nassim Noura;Loic Boulon; SamirJemei; 2019 IEEE Vehicle Power and Propulsion Conference (VPPC); IEEE Conference Paper. (Year: 2019).

Electric vehicle charging station using a neutral point clamped converter with bipolar DC bus and voltage balancing circuit Sebastian Rivera;Bin Wu;Jiacheng Wang;Hussain Athab;Samir Kouro; IECON 2013—39th Annual Conference of the IEEE Industrial Electronics Society; IEEE Conference Paper. (Year: 2013).

Theoretical Analysis of Pure Waiting Time for Battery Charging While Doing Something; Kazuyuki Miyakita;Keisuke Nakano;Hiroshi Tamura; 2015 IEEE Twelfth International Symposium on Autonomous Decentralized Systems; IEEE Con Ference Paper. (Year: 2015).

Mohamed Abdel-Monem et al., "Lithium-ion batteries: Comprehensive technical analysis of second-life batteries for smart grid applications"; 2017 19th European Conference on Power Electronics and Applications (EPE'17 ECCE Europe); IEEE (2017), 16 pps.

Serrao et al. "Optimal control of power split for a hybrid electric refuse vehicle"; 2018 American Control Conference; IEEE Conference Paper (2008), 6 pps.

H. Dagdougui, A. Qoammi and R. Sacile, "Optimal Control of a Network of Power Microgrids Using the Pontryagin's Minimum Principle," in IEEE Transactions on Control Systems Technology, vol. 22, No. 5, pp. 1942-1948, Sep. 2014, doi: 10.1109/TCST.2013. 2293954. (Year: 2014).

R. Razavian, N. L. Azad and J. McPhee, "On real-time optimal control of a series Hybrid Electric Vehicle with an ultra-capacitor," 2012 American Control Conference (ACC), 2012, pp. 547-552, doi: 10.1109/ACC.2012.6314831. (Year: 2012).

* cited by examiner

ELECTRONIC CONTROL SYSTEM FOR ELECTRIC REFUSE VEHICLE

CROSS-REFERENCE TO RELATED PATENT APPLICATIONS

The present application claims the benefit and priority to U.S. Provisional Patent Application No. 62/843,295, filed on May 3, 2019, the entire disclosure of which is incorporated by reference herein.

BACKGROUND

Refuse vehicles collect a wide variety of waste, trash, and other material from residences and businesses. Operators of the refuse vehicles transport the material from various waste receptacles within a municipality to a storage or processing facility (e.g., a landfill, an incineration facility, a recycling facility, etc.).

SUMMARY

One embodiment relates to a refuse vehicle including a chassis, a body assembly coupled to the chassis, the body assembly defining a refuse compartment, an electric energy system configured to store power and supply power to the refuse vehicle, and a power control system configured to measure one or more electrical attributes of the refuse vehicle and determine a power profile for the refuse vehicle, the power profile describing a length of time the refuse vehicle can continue to operate based on a remaining power of the electrical energy system, and wherein the power control system controls operation of a lift assembly of the refuse vehicle based on the power profile.

In some embodiments, the power control system determines an amount of power required to return the refuse vehicle to a charging location and performs an operation using the remaining power and the amount of power required to return the refuse vehicle to the charging location to determine a result and alerts a user based on the result. In some embodiments, the power control system is further configured to determine a weight of contents associated with the refuse compartment based on electrical attributes associated with the lift assembly. In some embodiments, determining the power profile includes moving a receptacle from a first position to a second position, measuring a first electrical parameter associated with the first movement, emptying the receptacle, moving the receptacle from the first position to the second position, and measuring a second electrical parameter associated with the second movement. In some embodiments, determining the power profile further includes calculating a weight associated with the receptacle based on the first and second electrical parameters. In some embodiments, the power profile describes a distance that the refuse vehicle can traverse based on the remaining power of the electrical energy system. In some embodiments, the power control system is configured to disable the lift assembly based on the power profile.

Another embodiment relates to a power control system for a refuse vehicle including a processing circuit including a processor and memory, the memory having instructions stored thereon that, when executed by the processor, cause the processing circuit to measure one or more first electrical parameters associated with an operation of the refuse vehicle, measure one or more second electrical parameters associated with an energy storage system associated with the refuse vehicle, generate an operational parameter associated with an amount of power required to perform the operation based on the one or more first electrical parameters and the one or more second electrical parameters, determine a power profile for the refuse vehicle, wherein the power profile describes a length of time the refuse vehicle can continue to operate based on the operational parameter, and transmit a control signal to the refuse vehicle based on the power profile.

In some embodiments, the power control system is further configured to measure an amount of remaining power associated with the energy storage system, determine an amount of power required to return the refuse vehicle to a charging location, perform an operation using the remaining power and the amount of power required to return the refuse vehicle to the charging location, determine, based on the operation, a result, and alert a user based on the result. In some embodiments, the power profile describes a distance that the refuse vehicle can traverse based on the amount of remaining power associated with the energy storage system. In some embodiments, the power control system is further configured to determine a weight of contents associated with a refuse compartment of the refuse vehicle based on the one or more first electrical parameters. In some embodiments, measuring the one or more first electrical parameters associated with the operation of the refuse vehicle includes moving a receptacle from a first position to a second position, measuring a first electrical parameter associated with the first movement, emptying the receptacle, moving the receptacle from the first position to the second position, and measuring a second electrical parameter associated with the second movement. In some embodiments, generating the operational parameter includes calculating a weight associated with the receptacle based on the first and second electrical parameters. In some embodiments, the power control system is configured to disable a lift assembly of the refuse vehicle based on the power profile. In some embodiments, the power control system is further configured to monitor a power consumption of the refuse vehicle and cause the energy storage system to store an amount of energy required to unload the refuse vehicle. In some embodiments, the power control system is further configured to transmit the power profile to an external fleet management system.

Another embodiment relates to a method of determining a power profile for a refuse vehicle including moving a receptacle from a first position to a second position, measuring a first electrical parameter associated with the first movement, emptying the receptacle, moving the receptacle from the first position to the second position, measuring a second electrical parameter associated with the second movement, measuring an amount of remaining power associated with an energy storage system of the refuse vehicle, and generate a power profile describing an amount of time the refuse vehicle can continue to operate based on the amount of remaining power and the first and second electrical parameters.

In some embodiments, the power profile further describes a distance that the refuse vehicle can traverse based on the amount of remaining power. In some embodiments, the method includes controlling an operation of the refuse vehicle based on the power profile. In some embodiments, the power profile is further generated based on one or more physical parameters associated with the refuse vehicle. In some embodiments, the method further includes determining a weight associated with contents of the receptacle and generating the power profile based on the weight. In some embodiments, the power profile further includes an indication of an amount of power required to return the refuse vehicle to a charging location.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

According to an exemplary embodiment, an electronic control system for a refuse vehicle is disclosed herein. The electronic control system of the present disclosure provides many advantages over conventional systems. The electronic control system may include sensors to measure one or more attributes of the refuse vehicle and/or components of the refuse vehicle. Sensor signals may be used to measure the performance of the refuse vehicle and optimize one or more functions of the refuse vehicle based on the measurements. The electronic control system may measure the power consumed by the components of the refuse vehicle and compare the measured power to a remaining power level of one or more power sources of the refuse vehicle to determine the period of operation remaining before the refuse vehicle is required to replenish (e.g, charge, refuel, etc.) the one or more power sources. Determining a remaining period of operation reduces a risk of running out of power during operation. Furthermore, the electronic control system may measure the weight of refuse receptacles to determine the remaining capacity of the refuse vehicle and/or to calculate the energy consumption of the refuse vehicle. Additionally or alternatively, the electronic control system may measure one or more spatial features of the refuse vehicle to determine a clearance of the refuse vehicle. A calculated clearance of the refuse vehicle may be displayed to the operator to inform operation of the refuse vehicle.

Overall Vehicle

Figure 1:
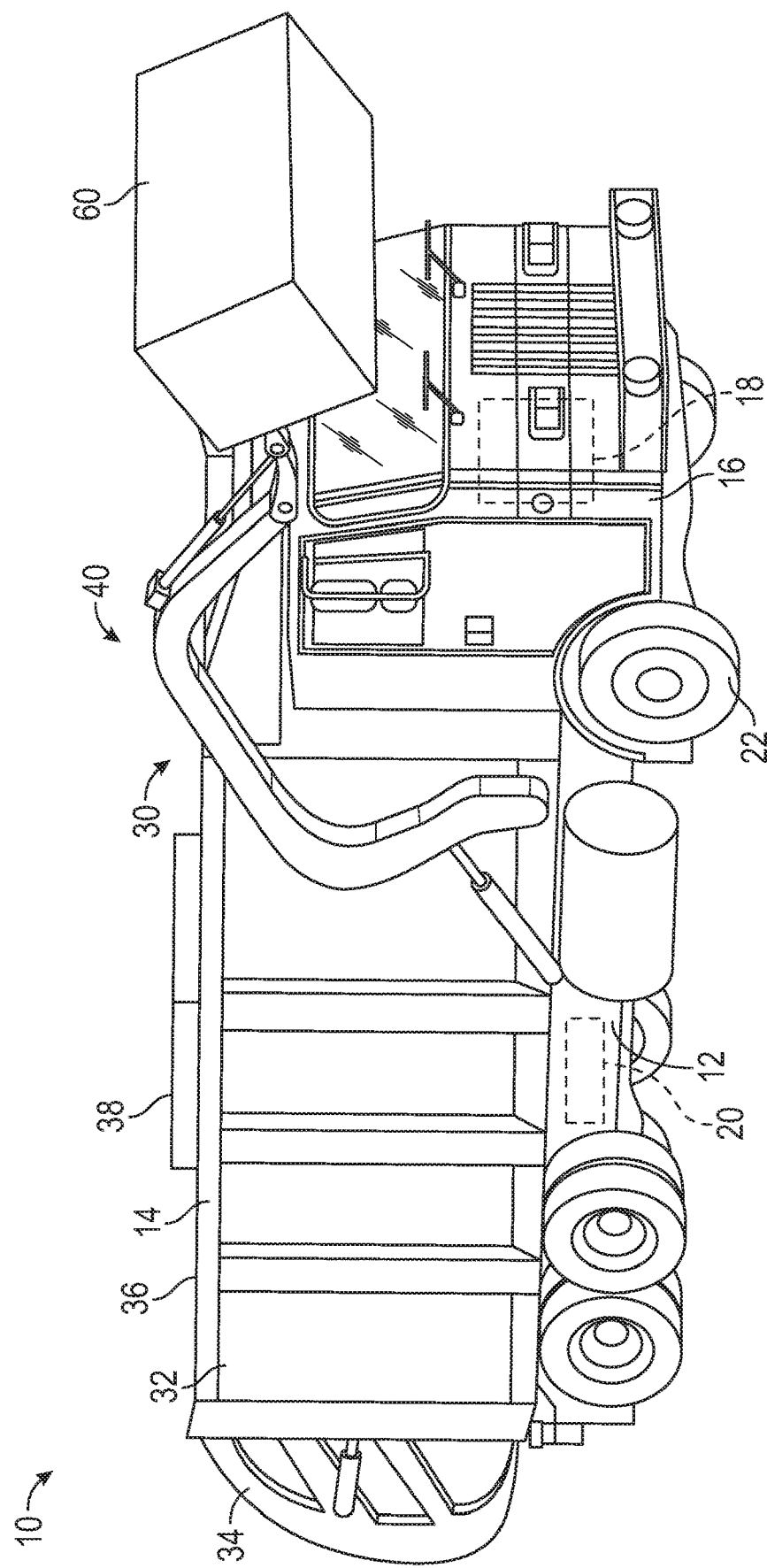
FIG. 1 is a perspective view of a refuse vehicle, according to an exemplary embodiment.

As shown in FIG. 1, a vehicle, shown as refuse vehicle 10 (e.g., a garbage truck, a waste collection truck, a sanitation truck, a recycling truck, etc.), is configured as a front-loading refuse truck. In other embodiments, the refuse vehicle 10 is configured as a side-loading refuse truck or a rear-loading refuse truck. In still other embodiments, the vehicle is another type of vehicle (e.g., a skid-loader, a telehandler, a plow truck, a boom lift, etc.). As shown in FIG. 1, the refuse vehicle 10 includes a chassis, shown as frame 12; a body assembly, shown as body 14, coupled to the frame 12 (e.g., at a rear end thereof, etc.); and a cab, shown as cab 16, coupled to the frame 12 (e.g., at a front end thereof, etc.). The cab 16 may include various components to facilitate operation of the refuse vehicle 10 by an operator (e.g., a seat, a steering wheel, actuator controls, a user interface, switches, buttons, dials, etc.).

As shown in FIG. 1, the refuse vehicle 10 includes a prime mover, shown as electric motor 18, and an energy system, shown as energy storage and/or generation system 20. In other embodiments, the prime mover is or includes an internal combustion engine. According to the exemplary embodiment shown in FIG. 1, the electric motor 18 is coupled to the frame 12 at a position beneath the cab 16. The electric motor 18 is configured to provide power to a plurality of tractive elements, shown as wheels 22 (e.g., via a drive shaft, axles, etc.). In other embodiments, the electric motor 18 is otherwise positioned and/or the refuse vehicle 10 includes a plurality of electric motors to facilitate independently driving one or more of the wheels 22. In still other embodiments, the electric motor 18 or a secondary electric motor is coupled to and configured to drive a hydraulic system that powers hydraulic actuators. According to the exemplary embodiment shown in FIG. 1, the energy storage and/or generation system 20 is coupled to the frame 12 beneath the body 14. In other embodiments, the energy storage and/or generation system 20 is otherwise positioned (e.g., within a tailgate of the refuse vehicle 10, beneath the cab 16, along the top of the body 14, within the body 14, etc.).

According to an exemplary embodiment, the energy storage and/or generation system 20 is configured to (a) receive, generate, and/or store power and (b) provide electric power to (i) the electric motor 18 to drive the wheels 22, (ii) electric actuators of the refuse vehicle 10 to facilitate operation thereof (e.g., lift actuators, tailgate actuators, packer actuators, grabber actuators, etc.), and/or (iii) other electrically operated accessories of the refuse vehicle 10 (e.g., displays, lights, etc.). The energy storage and/or generation system 20 may include one or more rechargeable batteries (e.g., lithium-ion batteries, nickel-metal hydride batteries, lithium-ion polymer batteries, lead-acid batteries, nickel-cadmium batteries, etc.), capacitors, solar cells, generators, power buses, etc. In one embodiment, the refuse vehicle 10 is a completely electric refuse vehicle. In other embodiments, the refuse vehicle 10 includes an internal combustion generator that utilizes one or more fuels (e.g., gasoline, diesel, propane, natural gas, hydrogen, etc.) to generate electricity to charge the energy storage and/or generation system 20, power the electric motor 18, power the electric actuators, and/or power the other electrically operated accessories (e.g., a hybrid refuse vehicle, etc.). For example, the refuse vehicle 10 may have an internal combustion engine augmented by the electric motor 18 to cooperatively provide power to the wheels 22. The energy storage and/or generation system 20 may thereby be charged via an on-board generator (e.g., an internal combustion generator, a solar panel system, etc.), from an external power source (e.g., overhead power lines, mains power source through a charging input, etc.), and/or via a power regenerative braking system, and provide power to the electrically operated systems of the refuse vehicle 10. In some embodiments, the energy storage and/or generation system 20 includes a heat management system (e.g., liquid cooling, heat exchanger, air cooling, etc.).

According to an exemplary embodiment, the refuse vehicle 10 is configured to transport refuse from various waste receptacles within a municipality to a storage and/or processing facility (e.g., a landfill, an incineration facility, a recycling facility, etc.). As shown in FIG. 1, the body 14 includes a plurality of panels, shown as panels 32, a tailgate 34, and a cover 36. The panels 32, the tailgate 34, and the cover 36 define a collection chamber (e.g., hopper, etc.), shown as refuse compartment 30. Loose refuse may be placed into the refuse compartment 30 where it may thereafter be compacted (e.g., by a packer system, etc.). The refuse compartment 30 may provide temporary storage for refuse during transport to a waste disposal site and/or a recycling facility. In some embodiments, at least a portion of the body 14 and the refuse compartment 30 extend above or in front of the cab 16. According to the embodiment shown in FIG. 1, the body 14 and the refuse compartment 30 are positioned behind the cab 16. In some embodiments, the refuse compartment 30 includes a hopper volume and a storage volume. Refuse may be initially loaded into the hopper volume and thereafter compacted into the storage volume. According to an exemplary embodiment, the hopper volume is positioned between the storage volume and the cab 16 (e.g., refuse is loaded into a position of the refuse compartment 30 behind the cab 16 and stored in a position further toward the rear of the refuse compartment 30, a front-loading refuse vehicle, a side-loading refuse vehicle, etc.). In other embodiments, the storage volume is positioned between the hopper volume and the cab 16 (e.g., a rear-loading refuse vehicle, etc.).

As shown in FIG. 1, the refuse vehicle 10 includes a lift mechanism/system (e.g., a front-loading lift assembly, etc.), shown as lift assembly 40, coupled to the front end of the body 14. In other embodiments, the lift assembly 40 extends rearward of the body 14 (e.g., a rear-loading refuse vehicle, etc.). In still other embodiments, the lift assembly 40 extends from a side of the body 14 (e.g., a side-loading refuse vehicle, etc.). As shown in FIG. 1, the lift assembly 40 is configured to engage a container (e.g., a residential trash receptacle, a commercial trash receptacle, a container having a robotic grabber arm, etc.), shown as refuse container 60. The lift assembly 40 may include various actuators (e.g., electric actuators, hydraulic actuators, pneumatic actuators, etc.) to facilitate engaging the refuse container 60, lifting the refuse container 60, and tipping refuse out of the refuse container 60 into the hopper volume of the refuse compartment 30 through an opening in the cover 36 or through the tailgate 34. The lift assembly 40 may thereafter return the empty refuse container 60 to the ground. According to an exemplary embodiment, a door, shown as top door 38, is movably coupled along the cover 36 to seal the opening thereby preventing refuse from escaping the refuse compartment 30 (e.g., due to wind, bumps in the road, etc.).

Electronic Control System

Figure 2:
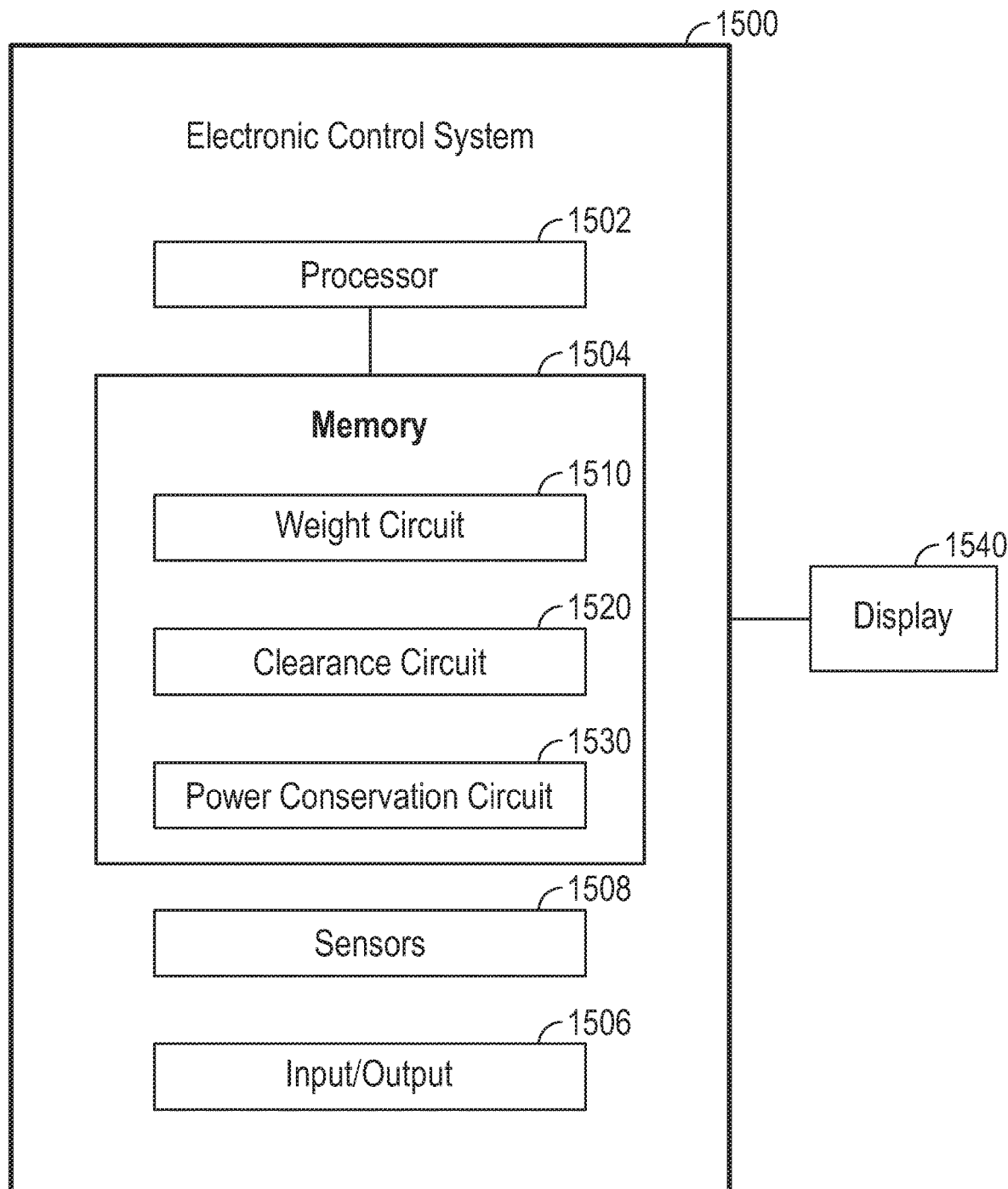
FIG. 2 is a block diagram of an electronic control system of the refuse vehicle of FIG. 1, according to an exemplary embodiment.

Referring now to FIG. 2, an electronic control system 1500 is shown, according to an exemplary embodiment. The electronic control system 1500 may be integrated with, or coupled to, the refuse vehicle 10. The electronic control system 1500 may receive one or more inputs from the refuse vehicle 10 and control operation of the refuse vehicle or refuse vehicle components based on the one or more inputs. In some embodiments, the electronic control system 1500 is integrated into one or more existing control system of the refuse vehicle 10 and in other embodiments the electronic control system 1500 is a standalone system. The electronic control system 1500 includes a processor 1502, memory 1504, input/output(s) 1506, and sensors 1508. In some embodiments, the electronic control system 1500 presents information to an operator of the refuse vehicle 10 via a display 1540. In some embodiments, the display 1540 includes an input device (e.g., touchscreen, keyboard, etc.) to allow the operator to interact with the electronic control system 1500. The display 1540 may be a cathode ray tube display (CRT), a light-emitting diode display (LED), an electroluminescent display (ELD), an electronic paper display, a plasma display, a liquid crystal display (LCD), an organic light-emitting diode display (OLED), or any other display or combination thereof known in the art.

The processor 1502 may be coupled to the memory 1504. The processor 1502 can be a general purpose or specific purpose processor, an application specific integrated circuit (ASIC), one or more field programmable gate arrays (FPGAs), a group of processing components, or other suitable processing components. The processor 1502 is configured to execute computer code or instructions stored in the memory 1504 or received from other computer readable media (e.g., CDROM, network storage, a remote server, etc.).

The memory 1504 can include one or more devices (e.g., memory units, memory devices, storage devices, etc.) for storing data and/or computer code for completing and/or facilitating the various processes described in the present disclosure. The memory 1504 can include random access memory (RAM), read-only memory (ROM), hard drive storage, temporary storage, non-volatile memory, flash memory, optical memory, or any other suitable memory for storing software objects and/or computer instructions. The memory 1504 can include database components, object code components, script components, or any other type of information structure for supporting the various activities and information structures described in the present disclosure. The memory 1504 can be communicably connected to the processor 1502 via a processing circuit and can include computer code for executing (e.g., by the processor 1502) one or more processes described herein. In various embodiments, memory 1504 includes weight circuit 1510, clearance circuit 1520, and power conservation circuit 1530.

In some embodiments, the input/outputs 1506 receive one or more signals from the refuse vehicle 10, or sub-systems thereof, and sends one or more signals to the refuse vehicle 10, or sub-systems thereof. In some embodiments, the input/outputs 1506 are used to control one or more components of the refuse vehicle 10. For example, the electronic control system 1500 may control the lift assembly 40 of the refuse vehicle 10 via the input/outputs 1506.

In some embodiments, the electronic control system 1500 receives information from the sensors 1508 and determines an operation of the refuse vehicle 10 or one or more components (e.g., lift assembly 40) of the refuse vehicle corresponding to the information received. In some embodiments, sensors 1508 are any of a current measuring device (e.g., an ammeter), a voltage-measuring device (e.g., a voltmeter, multimeter, etc.), a weight sensor, a temperature sensor, a position sensor, a camera, etc., or any other sensor or equipment. In some embodiments, the sensors 1508 are more than one sensor and/or more than one equipment. For example, the electronic control system 1500 receives information from multiple current measuring devices (e.g., an ammeter), according to some embodiments. In some embodiments, the sensors 1508 are a single sensor.

The weight circuit 1510 receives one more signals from sensors 1508 to determine a weight of a refuse receptacle.

The weight circuit 1510 may determine the weight of a residential trash receptacle, a commercial trash receptacle, and/or any other receptacle configured to be engaged by a member (e.g., the lift assembly 40, a robotic arm, a side loading refuse arm, etc.) of the refuse vehicle 10. The weight circuit 1510 may display the measured weight to an operator of the refuse vehicle 10 via the display 1540. Additionally or alternatively, the weight circuit 1510 may save the measured weight in the memory 1504 for later use. In some embodiments, the weight circuit 1510 determines if a component (e.g., the lift assembly 40) of the refuse vehicle 10 is overloaded and prevents damaging operation of the component.

The weight circuit 1510 determines a weight of a refuse receptacle based on one or more electrical measurements associated with the operation of one or more components of a lifting assembly (e.g., the lift assembly 40, a robotic arm, a side loading refuse arm, etc.) of the refuse vehicle 10. For example, the weight circuit 1510 may measure the electrical current draw of an electrical actuator driving the lift assembly 40 as the lift assembly 40 lifts a refuse receptacle and determine a weight of the refuse receptacle based on the electrical current draw of the electrical actuator. A process of the weight circuit 1510 determining a refuse receptacle weight is shown in detail with reference to FIG. 3.

The clearance circuit 1520 determines a clearance of the refuse vehicle 10 based on one or more signals from the sensors 1508. In some embodiments, the one or more signal values are associated with a position (e.g., an angle) of the refuse vehicle 10 and/or a position of a component (e.g., the lift assembly 40) of the refuse vehicle 10. The clearance circuit 1520 may display the instantaneous clearance of the refuse vehicle 10 to an operator via the display 1540. In some embodiments, the clearance circuit 1520 compares a clearance of the refuse vehicle 10 to a threshold clearance and alerts the operator if the refuse vehicle 10 clearance exceed the threshold clearance. For example, the clearance circuit 1520 may display, via the display 1540, a green color when the refuse vehicle 10 is below a threshold clearance, a yellow color when the refuse vehicle 10 is at or near a threshold clearance, and a red color when the refuse vehicle 10 has exceeded a threshold clearance. In some embodiments, the clearance circuit 1520 determines an allowable clearance and adjusts operation of the refuse vehicle 10 or components thereof (e.g., the lift assembly 40) to prevent exceeding the allowable clearance. For example, the clearance circuit 1520 may measure the distance to an overhead obstruction via a proximity sensor and prevent the lift assembly 40 from contacting the overhead obstruction.

In some embodiments, the clearance circuit 1520 determines a vertical clearance of the refuse vehicle 10. Additionally or alternatively, the clearance circuit 1520 may determine a horizontal clearance of the refuse vehicle 10. In some embodiments, the clearance circuit 1520 may include object recognition to determine nearby objects that are refuse receptacles and prevent a robotic arm of the refuse vehicle 10 from contacting nearby objects that are not classified as being a refuse receptacle. A process of the clearance circuit 1520 determining a clearance of the refuse vehicle 10 is described in detail with reference to FIG. 4.

The power conservation circuit 1530 receives one or more sensor signals to determine a power profile of the refuse vehicle 10 and control one or more components of the refuse vehicle 10 based on the power profile. The power conservation circuit 1530 may receive electrical measurements from one or more components (e.g., the lift assembly 40, the energy storage and/or generation system 20, etc.) of the refuse vehicle 10. For example, the power conservation circuit 1530 may receive the amount of electrical power required to operate the lift assembly 40 and compare it to the amount of remaining charge in the battery assembly 20. The power conservation circuit 1530 may display the instantaneous power consumed by the refuse vehicle 10 to an operator via the display 1540. Additionally or alternatively, the power conservation circuit 1530 may calculate a remaining operation time of the refuse vehicle 10 based on a current power consumption level and a remaining amount of power present in one or more power storage units of the refuse vehicle 10. In some embodiments, the power conservation circuit 1530 may alter operation of the refuse vehicle 10 to conserve power. In some embodiments, the power conservation circuit 1530 may calculate a required amount of power to return the refuse vehicle 10 to a charging location and alert the operator when the refuse vehicle 10 needs to return to a charging location. A process of the power conservation circuit 1530 determining a remaining power level for the refuse vehicle 10 is described in detail with reference to FIG. 5.

Figure 3:
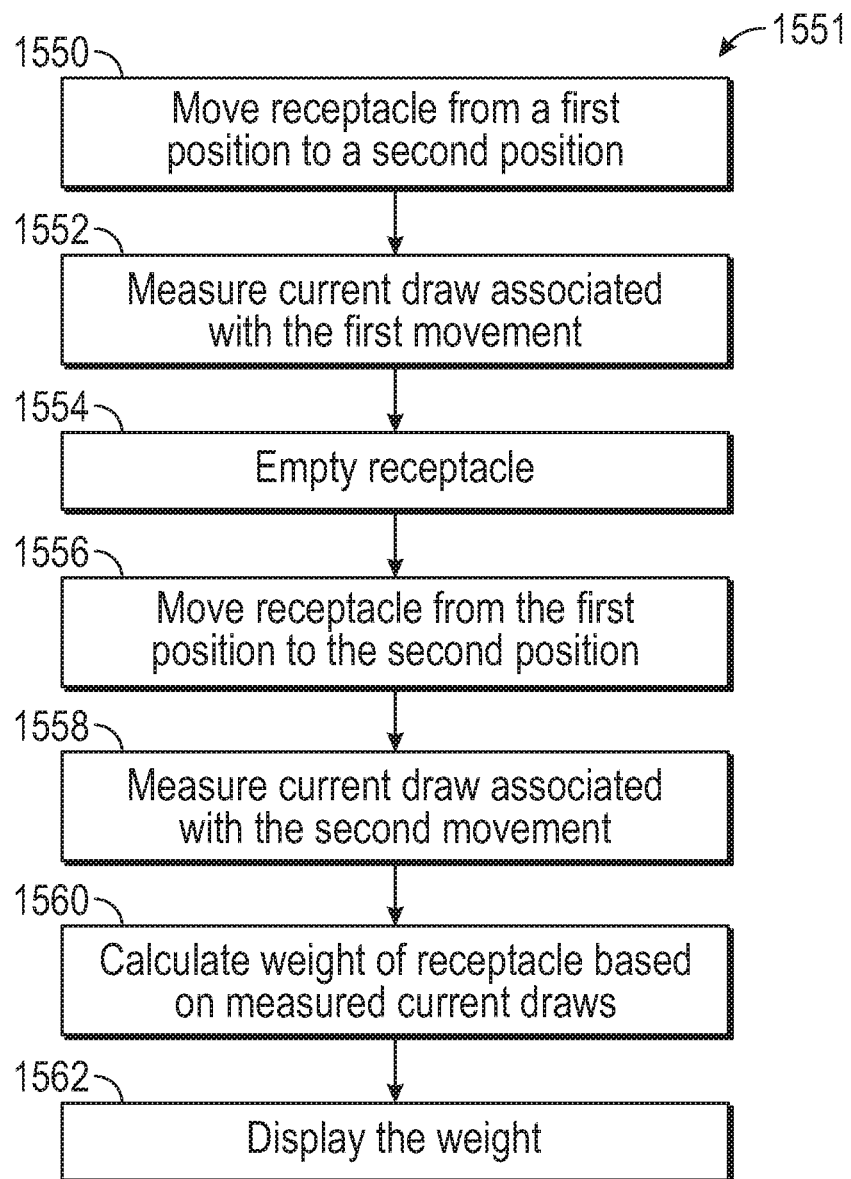
FIG. 3 is a block diagram of a process of the electronic control system of FIG. 2 for determining a weight of a refuse receptacle, according to an exemplary embodiment.

Referring now to FIG. 3, a process 1551 to determine a weight of a refuse receptacle is shown, according to an exemplary embodiment. The weight circuit 1510 may perform the process 1551. The process 1551 is described in reference to the lift assembly 40, however it should be understood that the process 1551 applies to any other lifting assembly (e.g., a robotic arm, a side loading refuse arm, etc.) of a refuse vehicle. Furthermore, although the process 1551 is described in reference to a refuse receptacle, it should be understood that the process 1551 applies to any object capable of being lifted by a lifting assembly of a refuse vehicle. At step 1550, the lift assembly 40 moves a refuse receptacle from a first position to a second position. In some embodiments, the second position is at a greater vertical height than the first position. At step 1552, the weight circuit 1510 measures, via sensors 1508, an electrical current draw of an electrical actuator of the lift assembly 40 resulting from moving the refuse receptacle from the first position to the second position. In some embodiments, the weight circuit 1510 measure an electrical current draw of a different component (e.g., an electric motor, etc.) of the lift assembly 40. At step 1554, the refuse receptacle is emptied. In some embodiments, the lift assembly 40 empties the refuse receptacle. At step 1556, the lift assembly moves the emptied refuse receptacle from the first position to the second position. At step 1558, the weight circuit 1510 measures an electrical current draw of an electrical actuator of the lift assembly 40 resulting from moving the emptied refuse receptacle from the first position to the second position. At step 1560, the weight circuit 1510 calculates a weight of the refuse receptacle based on the first and second measurements. For example, the weight circuit 1510 may use the measured current draw to determine a force exerted by the electrical actuator based on a look-up table of the electrical actuator and compare a difference in first force and the second force to determine a weight of the refuse receptacle. At step 1562, the weight circuit 1510 displays the calculated weight to the operator. In some embodiments, the weight circuit 1510 stores the calculate weight in memory 1504.

Figure 4:
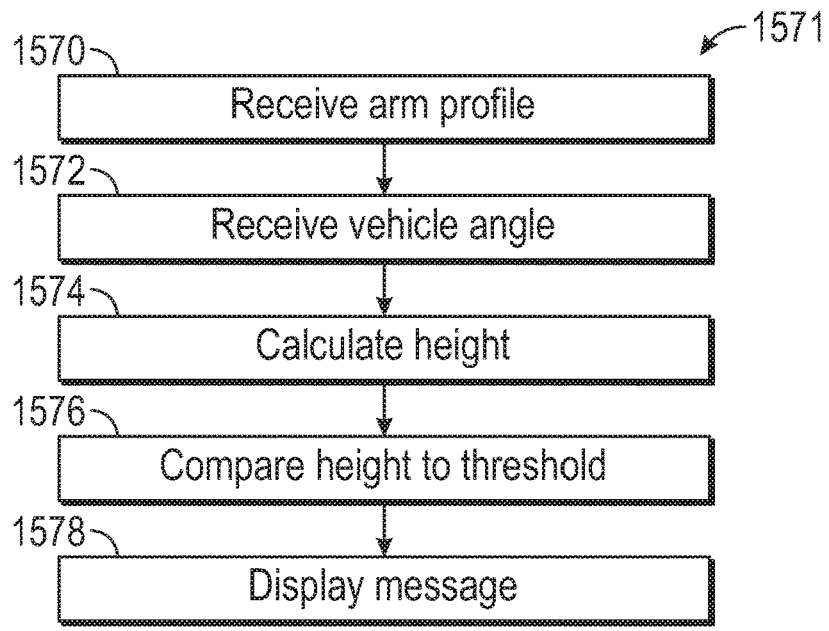
FIG. 4 is a block diagram of a process of the electronic control system of FIG. 2 for determining a clearance of a refuse vehicle, according to an exemplary embodiment.

Referring now to FIG. 4, a process 1571 to determine a clearance of the refuse vehicle 10 is shown, according to an exemplary embodiment. The process 1571 is described in reference to the lift assembly 40, however it should be understood that the process 1571 applies to any other lifting assembly (e.g., a robotic arm, a side loading refuse arm, etc.) of a refuse vehicle. Furthermore, although the process 1571 is described in reference to a vertical height clearance, it should be understood that the process 1571 applies to any other clearance including a horizontal clearance and/or a clearance of a side-loading lift assembly. At step 1570, the clearance circuit 1520 receives an arm profile for the lift assembly 40. The arm profile includes information relating to the current position of the lift assembly 40. For example, the arm profile may include a height, an orientation, an extension, or any other positional metric corresponding to the lift assembly 40. In some embodiments, the sensors 1508 provide the arm profile. Additionally or alternatively, the clearance circuit 1520 may receive the arm profile from one or more electric actuators or motors controlling the lift assembly 40 via input/outputs 1506. At step 1572, the clearance circuit 1520 receives an angle of the refuse vehicle 10. In some embodiments, the angle is received via a positional angle sensor of the sensors 1508.

At step 1574, the clearance circuit 1520 calculates a height of the refuse vehicle 10. The height may be calculated based on a geometry and/or positioning of the lift assembly 40 and an angle of the refuse vehicle 10. For example, if the refuse vehicle 10 is positioned facing downhill, then the clearance circuit 1520 may account for the relatively lower height of the lift assembly 40 at the front of the refuse vehicle 10 compared to the rear end of the refuse vehicle 10. In some embodiments, step 1574 accounts for a suspension height of the refuse vehicle 10. At step 1576, the clearance circuit 1520 compares the calculated height to a threshold value. In some embodiments, the threshold value is determined by an operator. In some embodiments, the threshold value is static (e.g., determined in software). Additionally or alternatively, the threshold value may be determined based on a proximity sensor of the sensors 1508. For example, the clearance circuit 1508 may measure the distance to an overhead obstruction. At step 1578, the clearance circuit 1520 displays, via the display 1540, a message based on the comparison to the operator. In some embodiments, the clearance circuit 1520 may alter or prevent operation of the lift assembly 40 based on the comparison. For example, the clearance circuit 1520 may prevent the operator from contacting an overhead obstruction with the lift assembly 40. In some embodiments, the clearance circuit 1520 displays different colors to the operator based on a distance of the lift assembly 1520 relative to an overhead obstruction.

Figure 5:
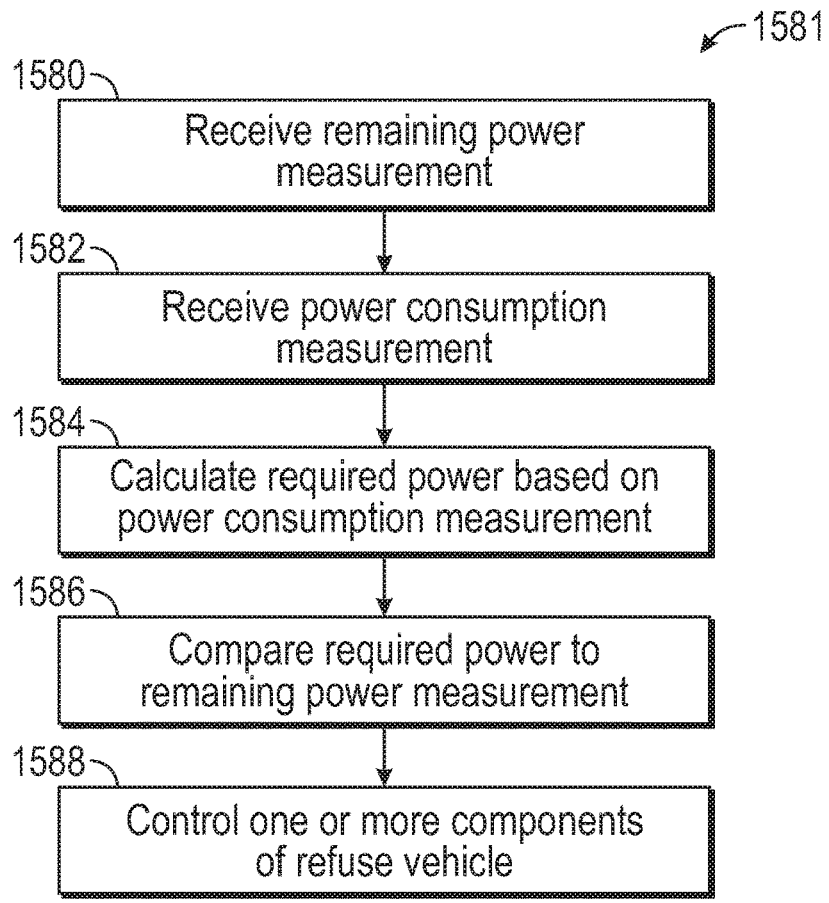
FIG. 5 is a block diagram of a process of the electronic control system of FIG. 2 for determining a power profile of a refuse vehicle, according to an exemplary embodiment.

Referring now to FIG. 5, a process 1581 for determining a power profile of the refuse vehicle 10 is shown, according to an exemplary embodiment. It should be understood that while the process 1581 is described in reference to controlling the operation of the lift assembly 40, the process 1581 applies to controlling any other component of the refuse vehicle 1581. Furthermore, although the process 1581 is described in reference to measuring an electrical current draw of the components of the lift assembly 40, it should be understood that the process 1581 applies to measuring any other operational value of a component of a refuse vehicle.

At step 1580, the power conservation circuit 1530 receives a remaining power measurement from sensors 1508 for a battery system of the refuse vehicle 10. In some embodiments, the remaining power measurement corresponds to the energy storage and/or generation system 20. Additionally or alternatively, the remaining power measurement may correspond to a different battery and/or power storage system. In some embodiments, step 1580 includes receiving an electrical current and/or voltage measurement and calculating a remaining power measurement. At step 1582, the power conservation circuit 1530 receives a power consumption measurement from one or more actuators of the lift assembly 40. In some embodiments, the power consumption measurement corresponds to an electrical motor or other device of the lift assembly 40. At step 1584, the power conservation circuit 1530 calculates a required power based on the power consumption measurement. In some embodiments, the power conservation circuit 1530 may determine a required power based on the number of refuse receptacle that need to be collected and the power required to collect each refuse receptacle. For example, the power conservation circuit 1530 may utilize the refuse receptacle weights stored by the weight circuit 1510. Additionally or alternatively, the power conservation circuit 1530 may determine a required power based on a distance from the refuse vehicle 10 to a charging location and an amount of power required to move the refuse vehicle 10.

At step 1586, the power conservation circuit 1530 compares the required power to the remaining power measurement. At step 1588, the power conservation circuit 1530 controls the electric actuators of the lift assembly 40, via input/outputs 1506, to operate at a slower speed to conserve energy. In some embodiments, the power conservation circuit 1530 prevents operation of the lift assembly 40. For example, if the power conservation circuit 1530 determines the refuse vehicle 10 has just enough remaining power to return to a charging location, the power conservation circuit 1530 may disable all non-essential functions of the refuse vehicle 10 to conserve power. Additionally or alternatively, the power conservation circuit 1530 may display, via display 1540, a message to the operator. For example, the power conservation circuit 1530 may alert the operator to return the refuse vehicle 10 to a charging location immediately.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of the refuse vehicle 10 and the systems and components thereof as shown in the various exemplary embodiments is illustrative only. Additionally, any element disclosed in one embodiment may be incorporated or utilized with any other embodiment disclosed herein. Although only one example of an element from one embodiment that can be incorporated or utilized in another embodiment has been described above, it should be appreciated that other elements of the various embodiments may be incorporated or utilized with any of the other embodiments disclosed herein.

The invention claimed is:

1. A refuse vehicle, comprising:
   a chassis;
   a body assembly coupled to the chassis, the body assembly defining a refuse compartment;
   an electric energy system configured to store power and supply power to at least one of the chassis and the body assembly; and
   a power control system configured to measure one or more electrical attributes of at least one of the chassis and the body assembly and determine a power profile for at least one of the chassis and the body assembly, the power profile describing a length of time the refuse vehicle can continue to operate based on a remaining power of the electric energy system; and
   wherein the power control system is configured to control operation of a lift assembly of the refuse vehicle based on the power profile.

2. The refuse vehicle of claim 1, wherein the power control system is configured to determine an amount of power required to return the refuse vehicle to a charging location, to perform an operation using the remaining power and the amount of power required to return the refuse vehicle to the charging location to determine a result, and to alert a user based on the result.

3. The refuse vehicle of claim 1, wherein the power control system is further configured to determine a weight of contents associated with the refuse compartment based on electrical attributes associated with the lift assembly, and wherein the power control system is configured to determine an amount of power required to return the refuse vehicle to a charging location based in part on the determined weight.

4. The refuse vehicle of claim 1, wherein determining the power profile includes:
   a first movement including moving a receptacle from a first position to a second position;

measuring a first electrical parameter associated with the first movement;
emptying the receptacle;
returning the receptacle to the first position after moving and emptying the receptacle;
a second movement including moving the empty receptacle from the first position to the second position; and
measuring a second electrical parameter associated with the second movement.

5. The refuse vehicle of claim 4, wherein determining the power profile further includes calculating a weight associated with the receptacle based on the first and second electrical parameters.

6. The refuse vehicle of claim 1, wherein the power profile describes a distance that the refuse vehicle can traverse based on the remaining power of the electric energy system.

7. The refuse vehicle of claim 1, wherein the power control system is configured to disable the lift assembly based on the power profile.

8. A power control system for a refuse vehicle, comprising:
a processing circuit including a processor and memory, the memory having instructions stored thereon that, when executed by the processor, cause the processing circuit to:
measure one or more first electrical parameters associated with an operation of the refuse vehicle;
measure one or more second electrical parameters associated with an energy storage system associated with the refuse vehicle;
generate an operational parameter associated with an amount of power required to perform the operation based on the one or more first electrical parameters and the one or more second electrical parameters;
determine a power profile for the refuse vehicle, wherein the power profile describes a length of time the refuse vehicle can continue to operate based on the operational parameter; and
transmit a control signal to the refuse vehicle based on the power profile.

9. The power control system of claim 8, wherein the power control system is further configured to:
measure an amount of remaining power associated with the energy storage system;
determine an amount of power required to return the refuse vehicle to a charging location;
perform an operation using the remaining power and the amount of power required to return the refuse vehicle to the charging location;
determine, based on the operation, a result; and
alert a user based on the result.

10. The power control system of claim 9, wherein the power profile describes a distance that the refuse vehicle can traverse based on the amount of remaining power associated with the energy storage system.

11. The power control system of claim 8, wherein the power control system is further configured to:
determine a weight of contents associated with a refuse compartment of the refuse vehicle based on the one or more first electrical parameters, and
determine an amount of power required to return the refuse vehicle to a charging location based in part on the determined weight.

12. The power control system of claim 8, wherein measuring the one or more first electrical parameters associated with the operation of the refuse vehicle includes:
a first movement including moving a receptacle from a first position to a second position;
measuring a first electrical parameter associated with the first movement;
emptying the receptacle;
returning the receptacle to the first position after moving and emptying the receptacle;
a second movement including moving the empty receptacle from the first position to the second position; and
measuring a second electrical parameter associated with the second movement.

13. The power control system of claim 12, wherein generating the operational parameter includes calculating a weight associated with the receptacle based on the first and second electrical parameters.

14. The power control system of claim 13, wherein the power control system is configured to disable a lift assembly of the refuse vehicle based on the power profile.

15. The power control system of claim 8, wherein the power control system is further configured to monitor a power consumption of the refuse vehicle and cause the energy storage system to store an amount of energy required to unload the refuse vehicle.

16. The power control system of claim 8, wherein the power control system is further configured to transmit the power profile to an external fleet management system.

17. A method of determining a power profile for a refuse vehicle, comprising:
measuring an initial remaining power amount associated with an energy storage system of the refuse vehicle;
a first movement including moving a receptacle from a first position to a second position;
measuring a first electrical parameter associated with the first movement;
emptying the receptacle;
returning the receptacle to the first position after moving and emptying the receptacle;
a second movement including moving the empty receptacle from the first position to the second position;
measuring a second electrical parameter associated with the second movement;
measuring a secondary remaining power amount associated with the energy storage system of the refuse vehicle; and
generating the power profile describing an amount of time the refuse vehicle can continue to operate based on the initial remaining power amount, the secondary remaining power amount, and the first and second electrical parameters.

18. The method of claim 17, wherein the power profile further describes a distance that the refuse vehicle can traverse based on the secondary remaining power amount.

19. The method of claim 17, wherein the method includes controlling an operation of the refuse vehicle based on the power profile.

20. The method of claim 17, wherein the power profile is further generated based on one or more physical parameters associated with the refuse vehicle.

* * * * *